(12) United States Patent
Cheng (10) Patent No.: US 11,626,322 B2
(45) Date of Patent: Apr. 11, 2023

(54) INTERCONNECTS WITH TIGHT PITCH AND REDUCED RESISTANCE

(71) Applicant: INTERNATIONAL BUSINESS MACHINES CORPORATION, Armonk, NY (US)

(72) Inventor: Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 26 days.

(21) Appl. No.: 17/353,058

(22) Filed: Jun. 21, 2021

(65) Prior Publication Data

US 2021/0313224 A1 Oct. 7, 2021

Related U.S. Application Data

(62) Division of application No. 16/419,356, filed on May 22, 2019, now Pat. No. 11,107,728.

(51) Int. Cl.
| | |
|---|---|
| *H01L 23/522* | (2006.01) |
| *H01L 21/768* | (2006.01) |
| *H01L 21/311* | (2006.01) |
| *H01L 23/528* | (2006.01) |
| *H01L 23/532* | (2006.01) |
| *H01L 21/3105* | (2006.01) |

(52) U.S. Cl.
CPC .. *H01L 21/76816* (2013.01); *H01L 21/31053* (2013.01); *H01L 21/31116* (2013.01); *H01L 21/76819* (2013.01); *H01L 21/76837* (2013.01); *H01L 21/76843* (2013.01); *H01L 21/76877* (2013.01); *H01L 23/5226* (2013.01); *H01L 23/5283* (2013.01); *H01L 23/5329* (2013.01)

(58) Field of Classification Search
CPC ......... H01L 21/76816; H01L 21/31053; H01L 21/31116; H01L 21/76819; H01L 21/76837; H01L 21/76843; H01L 23/5226; H01L 23/5329
See application file for complete search history.

(56) References Cited

U.S. PATENT DOCUMENTS

| | | | |
|---|---|---|---|
| 7,951,704 B2 | 5/2011 | Fang et al. | |
| 8,455,932 B2 | 6/2013 | Khakifirooz et al. | |
| 9,177,797 B2 | 11/2015 | Chang et al. | |
| 9,240,329 B2 | 1/2016 | deVilliers | |
| 9,379,056 B2 | 6/2016 | Zhong et al. | |
| 9,466,570 B1 * | 10/2016 | Cheng | H01L 21/823821 |
| 9,472,509 B2 | 10/2016 | Cho et al. | |

(Continued)

OTHER PUBLICATIONS

List of IBM Patents or Patent Applications Treated as Related dated Jun. 21, 2021, 2 pages.

*Primary Examiner* — Nathan W Ha
(74) *Attorney, Agent, or Firm* — Tutunjian & Bitetto, P.C.; Randy Emilio Tejeda (57) ABSTRACT

Integrated chips and methods of forming conductive lines thereon include forming parallel lines from alternating first and second dummy materials. Portions of the parallel lines are etched, using respective selective etches for the first and second dummy materials, to form gaps. The gaps are filled with a dielectric material. The first and second dummy materials are etched away to form trenches. The trenches are filled with conductive material.

18 Claims, 9 Drawing Sheets

(56) References Cited

U.S. PATENT DOCUMENTS

| | | | |
|---|---|---|---|
| 9,478,497 B2 | 10/2016 | Wells et al. | |
| 10,014,175 B2 | 7/2018 | Chang et al. | |
| 2014/0264903 A1* | 9/2014 | Chen | H01L 21/76819 438/619 |
| 2014/0349476 A1* | 11/2014 | Chen | H01L 21/76843 438/620 |
| 2015/0091174 A1* | 4/2015 | Clarke | H01L 21/76897 257/770 |
| 2016/0099174 A1* | 4/2016 | Wu | H01L 21/76811 438/618 |
| 2016/0365271 A1* | 12/2016 | Chang | H01L 21/76865 |
| 2016/0379891 A1* | 12/2016 | Park | H01L 21/76811 257/401 |
| 2017/0033048 A1* | 2/2017 | Kim | H01L 21/76897 |
| 2018/0082953 A1* | 3/2018 | Bi | H01L 23/5283 |
| 2019/0157139 A1* | 5/2019 | Cheng | H01L 23/5226 |
| 2019/0221523 A1* | 7/2019 | Singh | H01L 23/5226 |
| 2019/0221650 A1* | 7/2019 | Zang | H01L 29/66545 |
| 2019/0311944 A1* | 10/2019 | Park | H01L 21/76808 |
| 2020/0328154 A1* | 10/2020 | Jiang | H01L 21/31111 |
| 2020/0373165 A1* | 11/2020 | Park | H01L 29/45 |

\* cited by examiner

INTERCONNECTS WITH TIGHT PITCH AND REDUCED RESISTANCE

BACKGROUND

The present invention generally relates to semiconductor device fabrication and, more particularly, to forming semiconductor devices using tightly spaced lines and reduced interconnect resistance.

As devices scale down in size, decreasing the pitch between chip features faces certain practical limits. Some technologies form series of parallel lines and then cut those lines as needed to simplify the patterning process. However, with particularly tight pitches, inherent variations in lithography overlay and critical dimension can result in imprecise line cuts. If the cut opening is too large, it can produce undesired cuts in adjacent lines. If the cut opening is too small, it may result in incomplete cuts of the lines. Either problem can result in a non-functional chip, decreasing chip yield.

SUMMARY

A method of forming conductive lines includes forming parallel lines from alternating first and second dummy materials. Portions of the parallel lines are etched, using respective selective etches for the first and second dummy materials, to form gaps. The gaps are filled with a dielectric material. The first and second dummy materials are etched away to form trenches. The trenches are filled with conductive material.

A method of forming conductive lines includes forming a via that penetrates a dielectric layer. The via is filled with a first dummy material. Parallel lines are formed on the dielectric layer from alternating first and second dummy materials. Portions of the parallel lines are etched, using respective selective etches for the first and second dummy materials, to form gaps. The gaps are filled with a dielectric material. The first and second dummy materials are etched away to form trenches. The trenches and the via are filled with conductive material.

An integrated chip includes a dielectric layer that includes a conductive via. An interconnect layer on the dielectric layer includes a conductive line in contact with the dielectric layer. A diffusion barrier liner is formed around the conductive via and the conductive line and does not come between the conductive via and the conductive line.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention form conductive lines in a multilayer chip, including wires and vias, using a process that employs distinct and selectively etchable dummy materials in alternating lines. The alternating lines can then be cut using a selective etch. Even if the pattern for the cut is too large, such that it overlaps with an adjacent line, the etch selectivity of the materials prevents the cut from damaging the neighboring lines. The cut regions can then be filled with dielectric and the dummy materials can be removed. The conductive lines are then deposited in the gaps left by the dummy materials. Not only does this improve chip yield by preventing over-cutting due to misplaced masks, but also decreases contact resistance between lines and vias because both are formed at the same time, without the formation of a relatively high-resistance barrier layer between them.

Figure 1:
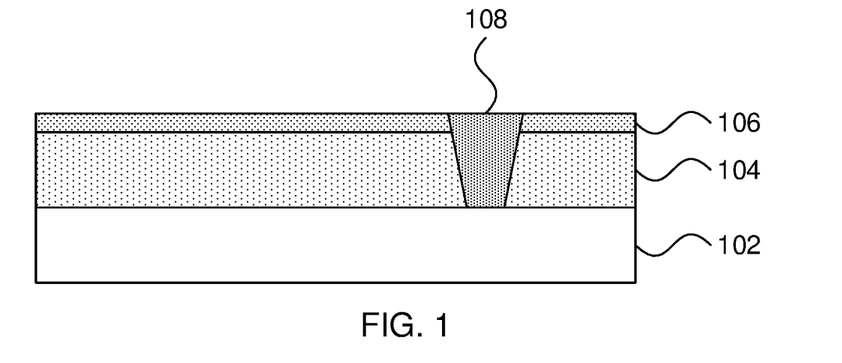
FIG. 1 is a cross-sectional diagram of a step in the formation of conductive lines on an integrated chip without an insulating barrier between the conductive lines and underlying vias that shows the formation of a dummy via in an interlayer dielectric in accordance with an embodiment of the present invention.

Referring now to the drawings in which like numerals represent the same or similar elements and initially to FIG. 1, a cross-sectional view of a step in the fabrication of conductive lines and vias is shown. A first interlayer dielectric 104 is formed on a semiconductor substrate 102. A cap layer 106 is formed on the interlayer dielectric 104. A dummy via 108 is formed that penetrates the cap layer 106 and the interlayer dielectric 104.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. Although not shown, the semiconductor substrate 102 can further comprise other devices and structures, including but not limited to, transistors, diodes, capacitors, resistors, isolation. Further layers below the substrate 102 can also be included.

The first interlayer dielectric 104 can be formed from any appropriate dielectric material, such as silicon dioxide, silicon oxycarbide (SiOC), carbon doped silicon oxide (SiO:C), fluorine doped silicon oxide (SiO:F), boron carbon nitride (BCN), hydrogen silsesquioxane polymer (HSQ), methyl silsesquioxane polymer (MSQ), methyl doped silica (SiO:(CH3)), organosilicate glass (SiCOH), porous SiCOH, and combinations thereof. The cap layer 106 can be formed from, e.g., silicon carbonitride or aluminum nitride. The dummy via 108 can be formed using a photolithographic mask or any other suitable patterning technique to establish a pattern for the via and anisotropically etching the exposed material using an anisotropic etch such as, e.g., a reactive ion etch (RIE). A first dummy material can then be deposited in the opening created by the anisotropic etch and can be polished down to a top level of the cap layer 106 using, e.g., a chemical mechanical planarization (CMP) process. It is specifically contemplated that the first dummy material can be amorphous silicon germanium, amorphous germanium, or any other suitable material that can be deposited at a compatible temperature, preferably below 450° C., and can be removed in later processing selective to other surrounding materials. In some embodiments, the dummy via material is deposited by chemical vapor deposition (CVD) and/or atomic layer deposition (ALD).

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

CMP is performed using, e.g., a chemical or granular slurry and mechanical force to gradually remove upper layers of the device. The slurry may be formulated to be unable to dissolve, for example, the cap layer material, resulting in the CMP process's inability to proceed any farther than that layer.

Figure 2:
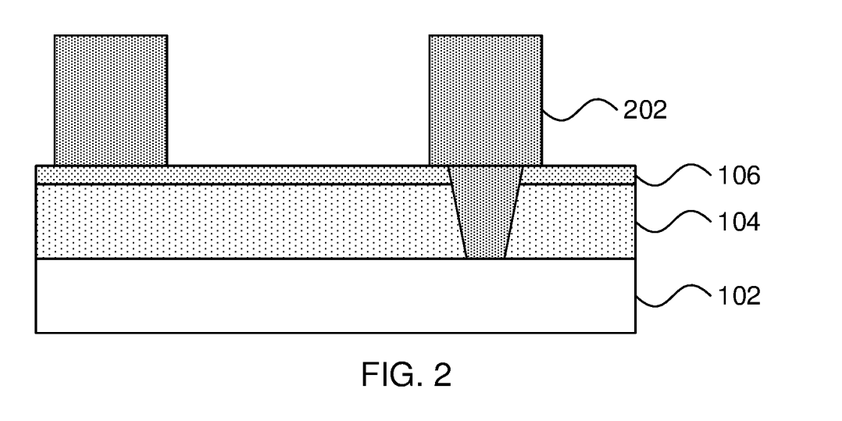
FIG. 2 is a cross-sectional diagram of a step in the formation of conductive lines on an integrated chip without an insulating barrier between the conductive lines and underlying vias that shows the formation mandrels of a first dummy material in accordance with an embodiment of the present invention.

Referring now to FIG. 2, a cross-sectional view of a step in the fabrication of conductive lines and vias is shown. A set of mandrels 202 are formed from the first dummy material on the cap layer 106. The mandrels 202 can be formed by photolithographic patterning, followed by an anisotropic etch. The mandrels 202 can be formed with a pitch that is twice as wide as the final pitch for the conductive lines to leave room for lines that are formed from a second dummy material. Some of the mandrels 202 can be formed over, and in contact with, one or more dummy vias 108. Although preferably the first mandrels 202 and the dummy via 108 can comprise the same material so they can be etched together in later processing, they can also have different materials. For example, the dummy via 108 can have amorphous silicon germanium while the first mandrels 202 can have amorphous silicon.

Figure 3:
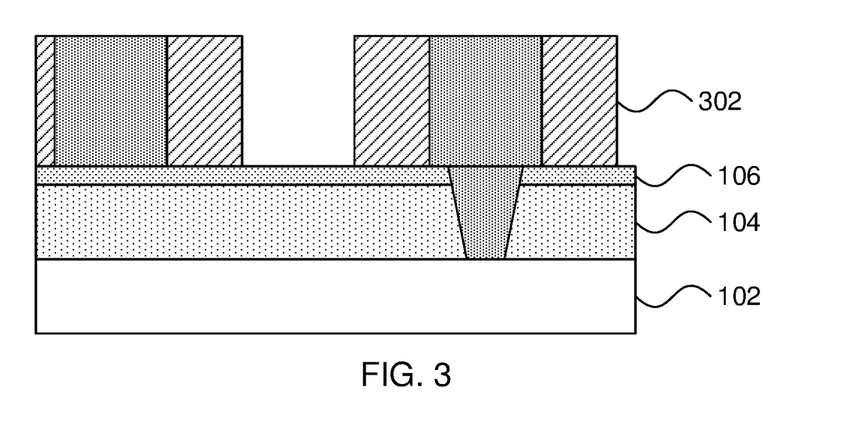
FIG. 3 is a cross-sectional diagram of a step in the formation of conductive lines on an integrated chip without an insulating barrier between the conductive lines and underlying vias that shows the formation spacers on sidewalls of the mandrels in accordance with an embodiment of the present invention.

Referring now to FIG. 3, a cross-sectional view of a step in the fabrication of conductive lines and vias is shown. Spacers 302 are formed on sidewalls of the mandrels 202. The spacers 302 can be formed from any appropriate material that has appropriate etch selectivity with the dummy materials. A conformal deposition process can be used, followed by a selective anisotropic etch to remove spacer material from horizontal surfaces. As used herein, the term "selective" in reference to a material removal process denotes that the rate of material removal for a first material is greater than the rate of removal for at least another material of the structure to which the material removal process is being applied.

In some embodiments, the spacers 302 can be formed from an ultra low-k material. An ultra low-k dielectric material is a material that has a dielectric constant that is much lower than the dielectric constant of silicon dioxide. Ultra low-k material is preferred because the spacers serve as the electrical isolation between adjacent conductive lines formed in later processing. Using ultra low-k dielectric material between conductive lines reduces the parasitic capacitance of the final structure and thereby improves device performance. Examples of ultra low-k materials include carbon doped silicon oxide (SiO:C), fluorine doped silicon oxide (SiO:F), hydrogen silsesquioxane polymer (HSQ), methyl silsesquioxane polymer (MSQ), methyl doped silica (SiO:(CH3)), organosilicate glass (SiCOH).

Figure 4:
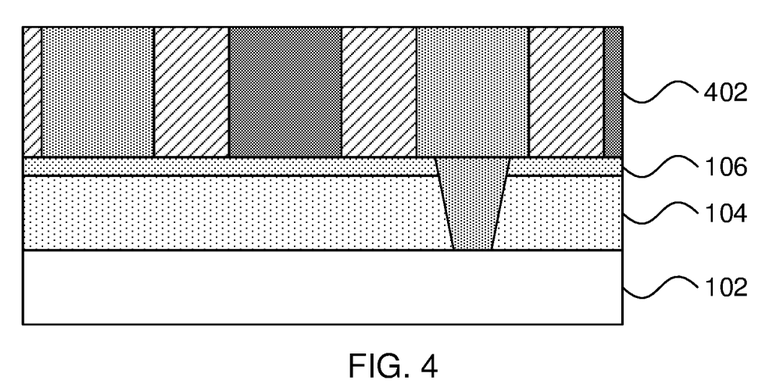
FIG. 4 is a cross-sectional diagram of a step in the formation of conductive lines on an integrated chip without an insulating barrier between the conductive lines and underlying vias that shows the formation of mandrels of a second dummy material in accordance with an embodiment of the present invention.

Referring now to FIG. 4, a cross-sectional view of a step in the fabrication of conductive lines and vias is shown. A second dummy material is filled into gaps between the spacers 302 using any appropriate conformal deposition process such as, e.g., chemical vapor deposition (CVD), physical vapor deposition (PVD), atomic layer deposition (ALD), or gas cluster ion beam (GCIB) deposition. A CMP process can then be used to polish away any of the second dummy material remaining above the first mandrels 202, leaving behind second mandrels 402. It should be noted that the dummy vias 108 need not match the material of the overlying mandrels. Thus, some dummy vias 108, which are formed from the first dummy material, may be covered by second mandrels 402, formed from the second dummy material.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 5:
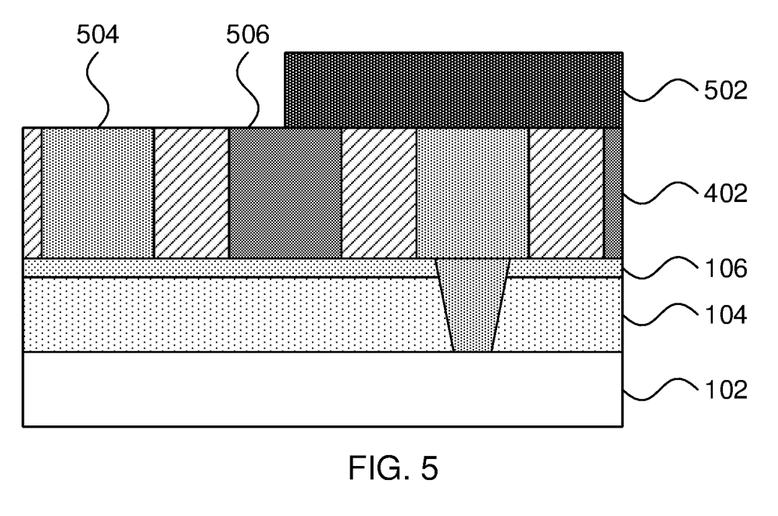
FIG. 5 is a cross-sectional diagram of a step in the formation of conductive lines on an integrated chip without an insulating barrier between the conductive lines and underlying vias that shows the formation of a first mask in accordance with an embodiment of the present invention.

Referring now to FIG. 5, a cross-sectional view of a step in the fabrication of conductive lines and vias is shown. A first mask 502 is formed over the top surface, leaving at least one first mandrel 504 exposed, for example using a photolithographic process. Although the present example is illustrated as exposing a mandrel made of the first dummy material 202, it should be understood that the present embodiments could equivalently leave a mandrel made of the second dummy material 402 exposed instead. In addition to the exposed mandrel 504, at least a portion of an adjacent mandrel 506 is also exposed. This can be the result of errors in the positioning of the mask 502.

Figure 6:
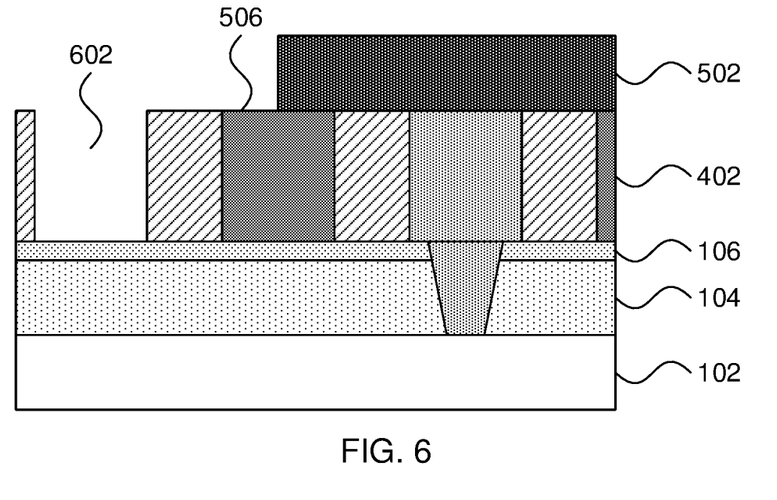
FIG. 6 is a cross-sectional diagram of a step in the formation of conductive lines on an integrated chip without an insulating barrier between the conductive lines and underlying vias that shows etching away exposed portions of the first dummy material in accordance with an embodiment of the present invention.

Referring now to FIG. 6, a cross-sectional view of a step in the fabrication of conductive lines and vias is shown. A selective etch is employed to remove the exposed portions of the first mandrel 504. The selective etch is formulated to remove material from the first mandrel 504, without substantially damaging the adjacent mandrel 506. Any appropriate isotropic or anisotropic etch process can be used. The etch leaves gaps 602.

Figure 7:
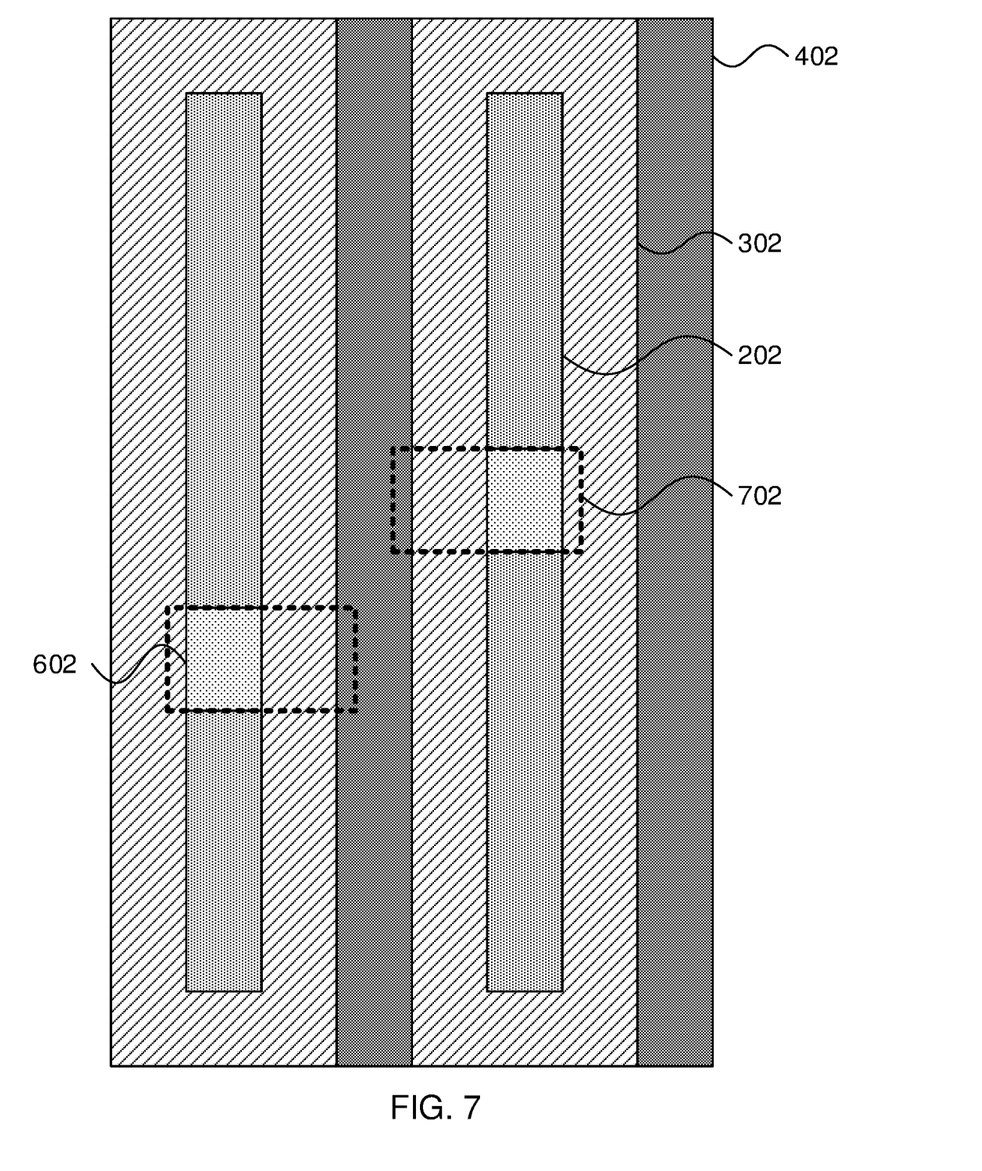
FIG. 7 is a top-down diagram of a step in the formation of conductive lines on an integrated chip without an insulating barrier between the conductive lines and underlying vias that shows the regions exposed by the first mask in accordance with an embodiment of the present invention.

Referring now to FIG. 7, a top-down view of a step in the fabrication of conductive lines and vias is shown. In this view, the gaps 602 are shown within cut regions 702. The cut regions 702 are the regions that are left exposed by the first mask 502 (not shown in this view). This view omits the first mask 502, showing the portions of the first mandrels 302 and second mandrels 402 that remain.

Figure 8:
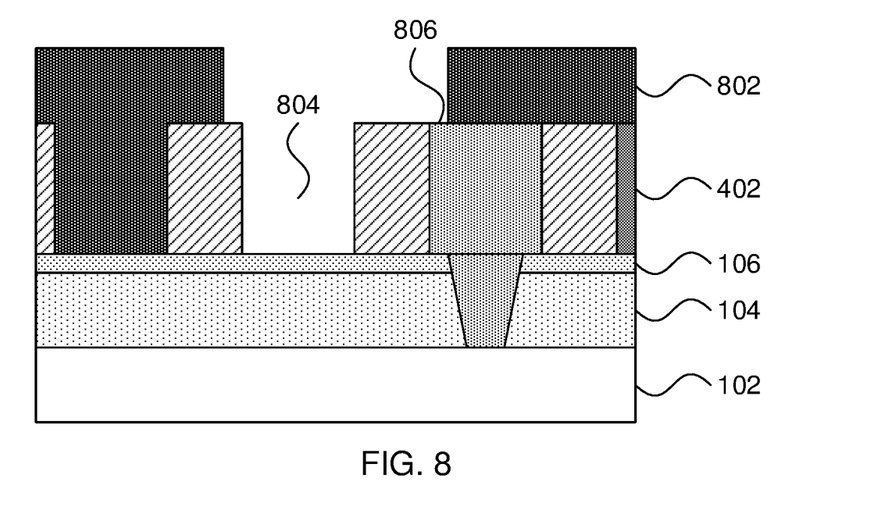
FIG. 8 is a cross-sectional diagram of a step in the formation of conductive lines on an integrated chip without an insulating barrier between the conductive lines and underlying vias that shows the formation of a second mask and etching away exposed portions of the second dummy material in accordance with an embodiment of the present invention.

Referring now to FIG. 8, a cross-sectional view of a step in the fabrication of conductive lines and vias is shown. The first mask 802 is formed, exposing at least one second mandrel 802 and at least a portion of an adjacent mandrel 806. Whichever dummy material was exposed by the first mask 502 is now substantially covered by the second mask 504, though errors in the masking process may leave parts of that material exposed. A selective can then be performed to etch away the exposed portions of the second mandrel 802, leaving gap 804. As with the previous etch, the selective etch does not substantially harm the exposed adjacent mandrel 806.

Figure 9:
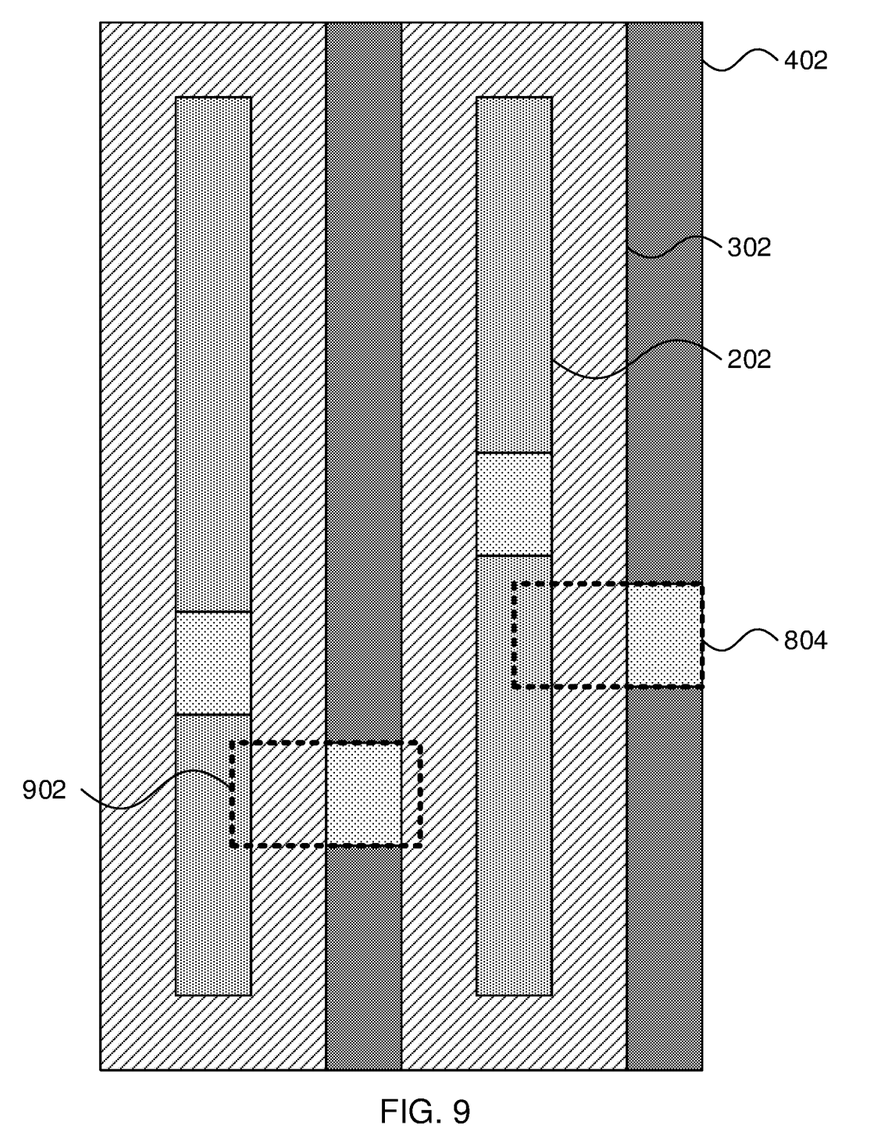
FIG. 9 is a top-down diagram of a step in the formation of conductive lines on an integrated chip without an insulating barrier between the conductive lines and underlying vias that shows the regions exposed by the second mask in accordance with an embodiment of the present invention.

Referring now to FIG. 9, a top-down view of a step in the fabrication of conductive lines and vias is shown. In this view, the gaps 804 are shown within the cut regions 902. The cut regions 902 are the regions that are left exposed by the second mask 802. This view omits the first mask 802, showing the portions of the first mandrels 302 and second mandrels 402 that remain. In this manner, appropriate cuts can be made without risking over-cutting due to misplacement of the masks.

Figure 10:
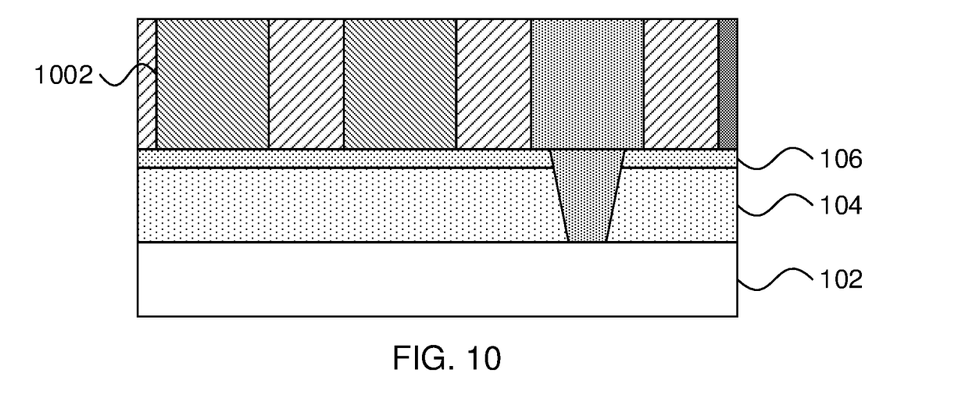
FIG. 10 is a cross-sectional diagram of a step in the formation of conductive lines on an integrated chip without an insulating barrier between the conductive lines and underlying vias that shows the formation of dielectric material in the etched regions in accordance with an embodiment of the present invention.

Referring now to FIG. 10, a cross-sectional view of a step in the fabrication of conductive lines and vias is shown. The gaps 602 and 804 are filled with a dielectric material to form plugs 1002. This dielectric material can be any electrically insulating material with appropriate etch selectivity including, for example, aluminum nitride, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycarbonitride (SiOCN), or any suitable combination of those materials.

Figure 11:
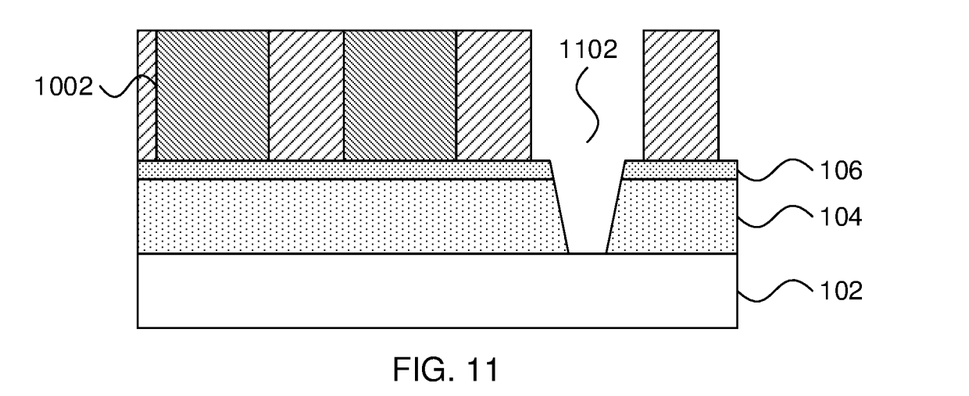
FIG. 11 is a cross-sectional diagram of a step in the formation of conductive lines on an integrated chip without an insulating barrier between the conductive lines and underlying vias that shows etching away remaining first and second dummy materials in accordance with an embodiment of the present invention.

Referring now to FIG. 11, a cross-sectional view of a step in the fabrication of conductive lines and vias is shown. The remaining first dummy material and second dummy material are etched away using one or more selective etches that leave the spacers 302 and the plugs 1002 substantially undamaged. This process opens gaps 1102, some of which can penetrate through the interlayer dielectric 104.

Figure 12:
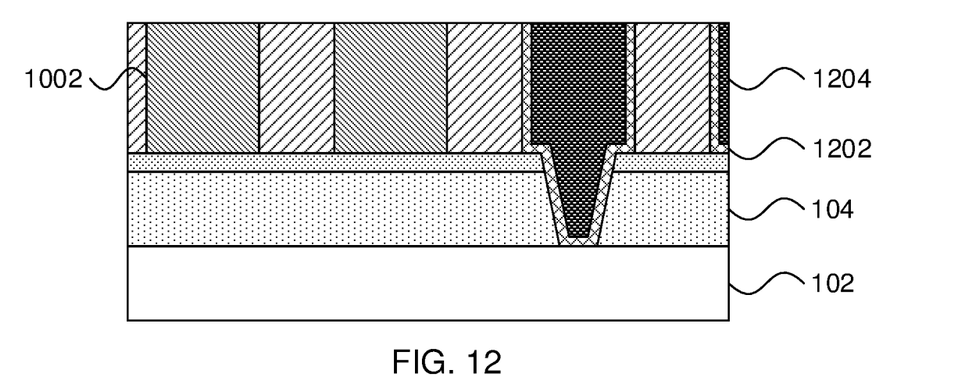
FIG. 12 is a cross-sectional diagram of a step in the formation of conductive lines on an integrated chip without an insulating barrier between the conductive lines and underlying vias that shows the formation of a liner and conductive material in accordance with an embodiment of the present invention.

Referring now to FIG. 12, a cross-sectional view of a step in the fabrication of conductive lines and vias is shown. A liner 1202 is first deposited in the gaps 1102, followed by a conductor 1204. The liner 1202 can be formed from, e.g., titanium nitride, tantalum nitride, or any other appropriate material to serve as a diffusion barrier that prevents the conductive material from diffusing into the neighboring dielectric material.

The conductor 1204 may be formed from any appropriate conductive metal such as, e.g., tungsten, nickel, titanium, molybdenum, tantalum, copper, platinum, silver, gold, ruthenium, iridium, rhenium, rhodium, and alloys thereof. Alternatively, the conductor 1204 may be formed from carbon nanotubes, and/or graphene.

Because the conductor 1204 is formed all at once, rather than being formed with one part in the interlayer dielectric 104 and another in the overlying layer, there is no layer of the liner material between an upper part and a lower part. The lack of a liner between the conductive lines and the vias reduces contact resistance between these structures.

Figure 13:
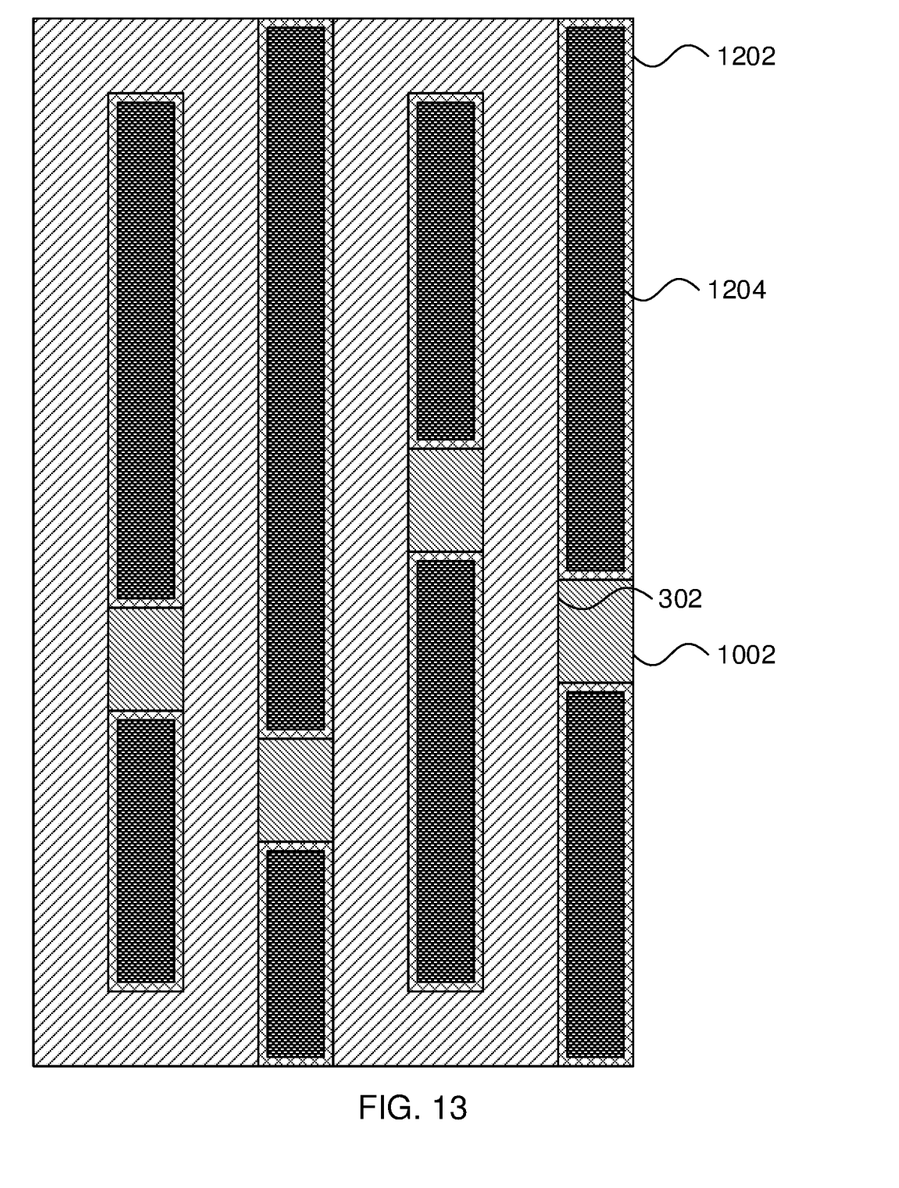
FIG. 13 is a top-down diagram of a step in the formation of conductive lines on an integrated chip without an insulating barrier between the conductive lines and underlying vias that shows the conductive lines in accordance with an embodiment of the present invention.

Referring now to FIG. 13, a top-down view of a step in the fabrication of conductive lines and vias is shown. The conductors 1204 are shown as being separated by plugs 1002 and the spacers 302.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises." "comprising." "includes" and/or "including." when used herein, specify the presence of stated features, integers, steps, operations, elements and/or components, but do not preclude the presence or addition of one or more other features, integers, steps, operations. elements, components and/or groups thereof.

Spatially relative terms, such as "beneath." "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers. it can be the only layer between the two layers. or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 14:
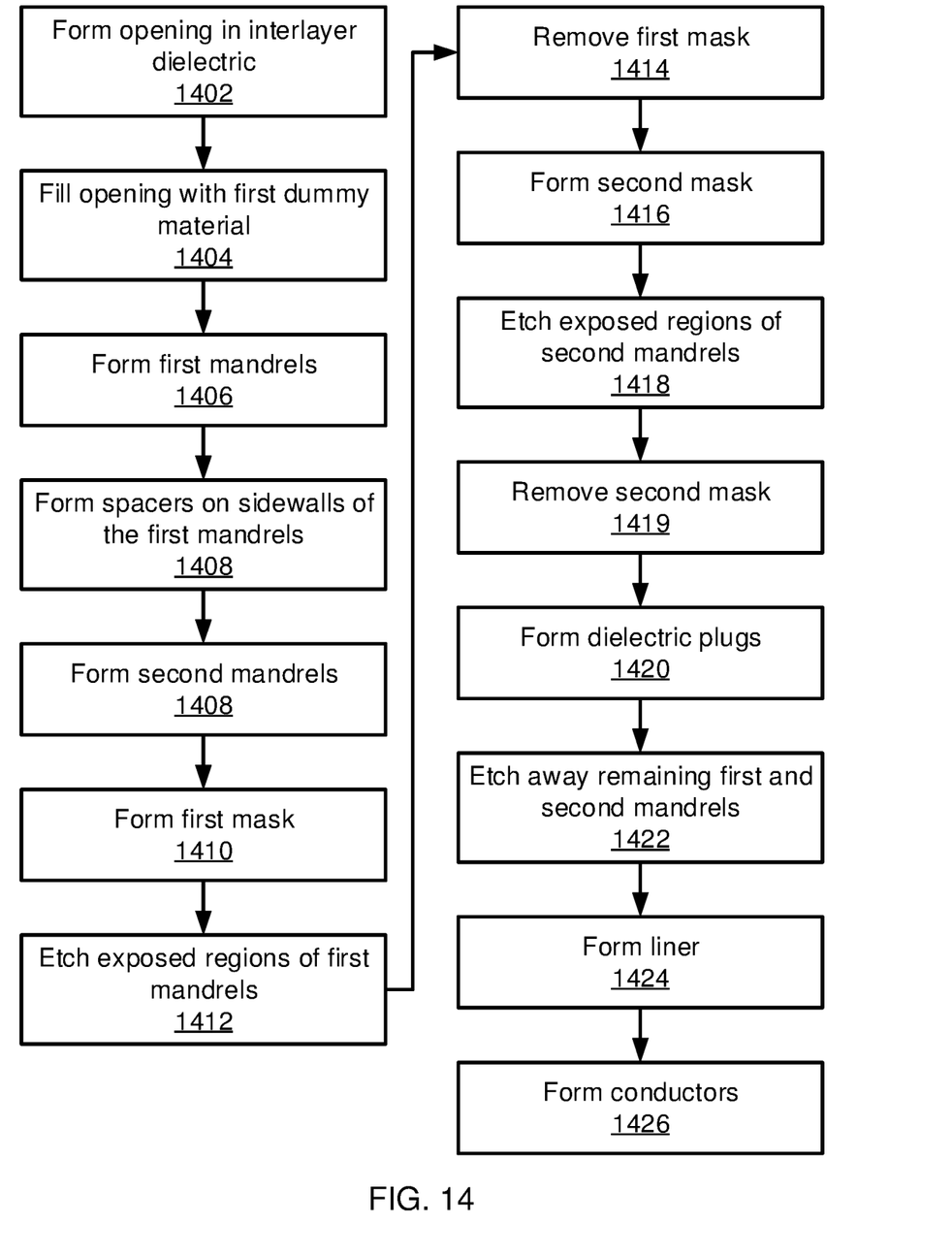
FIG. 14 is a block/flow diagram of a method of forming conductive lines on an integrated chip without an insulating barrier between the conductive lines and underlying vias in accordance with an embodiment of the present invention.

Referring now to FIG. 14, a method of forming conductive lines and vias is shown. Block 1402 forms one or more openings in an interlayer dielectric 104 using any appropriate masking and etching process, for example including the formation of a photolithographic mask and RIE. Block 1404 fills the one or more openings with a first dummy material, such as amorphous silicon germanium, to form dummy vias 108.

Block 1406 forms first mandrels 202 from the first dummy material on the interlayer dielectric 104. At least one of the first mandrels 202 contacts at least one dummy via 108. The first mandrels 202 can be formed by any appropriate process, such as photolithographic patterning and an anisotropic etch. Block 1408 then forms spacers 302 on sidewalls of the first mandrels 302 by conformally depositing the spacer material and then anisotropically etching away the spacer material from horizontal surfaces. Block 1408 forms second mandrels 402 in the remaining open spaces, filling in a second dummy material, such as silicon dioxide, and polishing down to the level of the first mandrels 202.

Block 1410 forms a first mask 502 that exposes at least a portion of a first mandrel 504. Block 1412 etches the exposed region of the first mandrel 504 using a selective etch that does not substantially damage any exposed portion of adjacent second mandrels 506. Block 1414 removes the first mask 502 and block 1416 forms a second mask 802 that exposes at least a portion of a second mandrel. Block 1418 etches the exposed portion of the second mandrel using a selective etch that does not substantially damage any exposed portion of adjacent first mandrels 806. Block 1419 then removes the second mask 802.

Block 1420 forms dielectric plugs in the spaces left by the etched first and second mandrels using, e.g., a conformal deposition process that fills the gaps, followed by a CMP process that polishes the material down to the top level of the remaining first and second mandrels. Block 1422 etches away the remaining first and second mandrels, leaving gaps 1102. Block 1424 forms a liner from, e.g., titanium nitride using a conformal deposition process. Block 1426 forms conductors in the gaps 1102, for example using any appropriate deposition process, followed by a CMP process.

Having described preferred embodiments of interconnects with tight pitch and reduced resistance (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An integrated chip, comprising:
   a dielectric layer that includes a conductive via;
   an interconnect layer on the dielectric layer that includes a first conductive line in contact with the dielectric layer;
   a dielectric plug at an end of the first conductive line; and
   a diffusion barrier liner, formed around the conductive via and the conductive line, that does not come between the conductive via and the conductive line.

2. The integrated chip of claim 1, further comprising a second conductive line, formed in parallel with the first conductive line.

3. The integrated chip of claim 2, further comprising a spacer, formed between the first conductive line and the second conductive line.

4. The integrated chip of claim 3, wherein the dielectric plug is formed from a different material than a material of the spacer.

5. The integrated chip of claim 1, wherein the dielectric plug is formed from a dielectric material selected from the group consisting of aluminum nitride, silicon nitride, silicon carbide, silicon oxynitride, carbon-doped silicon oxide, silicon-carbon-nitride, boron nitride, silicon boron nitride, silicoboron carbonitride, and silicon oxycarbonitride.

6. The integrated chip of claim 1, further comprising a third conductive line, formed at a side of the dielectric plug opposite to the first conductive line.

7. The integrated chip of claim 3, wherein the spacer is formed from an ultra low-k material.

8. The integrated chip of claim 7, wherein the spacer is formed from an ultra low-k material selected from the group consisting of carbon-doped silicon oxide, fluorine-doped silicon oxide, hydrogen silsesquioxane polymer, methyl silsesquioxane polymer, methyl-doped silica, and organosilicate glass.

9. An integrated chip, comprising:
   a dielectric layer that includes a conductive via;
   an interconnect layer on the dielectric layer that includes:
   a first conductive line in contact with the dielectric layer;
   a second conductive line in contact with the dielectric layer, formed in parallel with the first conductive line;
   a dielectric plug at an end of the first conductive line;
   a spacer, formed from an ultra low-k material, between the first conductive line and the second conductive line; and
   a diffusion barrier liner, formed around the conductive via and the conductive line, that does not come between the conductive via and the conductive line.

10. The integrated chip of claim 9, wherein the dielectric plug is formed from a different material than a material of the spacer.

11. The integrated chip of claim 9, wherein the dielectric plug is formed from a dielectric material selected from the group consisting of aluminum nitride, silicon nitride, silicon carbide, silicon oxynitride, carbon-doped silicon oxide, silicon-carbon-nitride, boron nitride, silicon boron nitride, silicoboron carbonitride, and silicon oxycarbonitride.

12. The integrated chip of claim 9, further comprising a third conductive line, formed at a side of the spacer opposite to the first conductive line.

13. The integrated chip of claim 9, wherein the diffusion barrier liner is in direct contact with the dielectric plug.

14. The integrated chip of claim 9, wherein the spacer is formed from an ultra low-k material selected from the group consisting of carbon-doped silicon oxide, fluorine-doped silicon oxide, hydrogen silsesquioxane polymer, methyl silsesquioxane polymer, methyl-doped silica, and organosilicate glass.

15. An integrated chip, comprising:
   a dielectric layer that includes a conductive via;
   an interconnect layer on the dielectric layer that includes:
   a first conductive line in contact with the dielectric layer;
   a second conductive line in contact with the dielectric layer, formed in parallel with the first conductive line;
   a spacer, formed from an ultra low-k material, between the first conductive line and the second conductive line;
   a dielectric plug, formed from a material different from the material of the spacer, at an end of the first conductive line; and
   a third conductive line formed at a side of the dielectric plug opposite to the first conductive line; and
   a diffusion barrier liner, formed around the conductive via and the conductive line, that does not come between the conductive via and the conductive line.

16. The integrated chip of claim 15, wherein the dielectric plug is formed from a dielectric material selected from the group consisting of aluminum nitride, silicon nitride, silicon carbide, silicon oxynitride, carbon-doped silicon oxide, silicon-carbon-nitride, boron nitride, silicon boron nitride, silicoboron carbonitride, and silicon oxycarbonitride.

17. The integrated chip of claim 15, wherein the spacer is formed from an ultra low-k material selected from the group consisting of carbon-doped silicon oxide, fluorine-doped silicon oxide, hydrogen silsesquioxane polymer, methyl silsesquioxane polymer, methyl-doped silica, and organosilicate glass.

18. The integrated chip of claim 15, wherein the diffusion barrier liner is in direct contact with the dielectric plug.

* * * * *